(12) United States Patent
Strachan et al.

(10) Patent No.: US 7,192,853 B1
(45) Date of Patent: Mar. 20, 2007

(54) METHOD OF IMPROVING THE BREAKDOWN VOLTAGE OF A DIFFUSED SEMICONDUCTOR JUNCTION

(75) Inventors: Andrew Strachan, Santa Clara, CA (US); Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/659,421

(22) Filed: Sep. 10, 2003

(51) Int. Cl.
*H01L 21/04* (2006.01)

(52) U.S. Cl. .............. 438/510; 438/555; 257/E21.056; 257/E21.466

(58) Field of Classification Search ............ 438/45, 438/194, 217, 289, 510, 514, 542, 546–549, 438/553, 554, 914, 942, 555; 257/E21.466, 257/E21.056
See application file for complete search history.

(56) References Cited

U.S. PATENT DOCUMENTS

| 5,079,176 A | * | 1/1992 | Prentice | 438/335 |
| 5,275,961 A | * | 1/1994 | Smayling et al. | 438/286 |
| 5,736,445 A | * | 4/1998 | Pfirsch | 438/275 |
| 5,795,793 A | * | 8/1998 | Kinzer | 438/307 |
| 6,121,089 A | * | 9/2000 | Zeng et al. | 438/268 |
| 6,699,775 B2 | * | 3/2004 | Bol et al. | 438/514 |

* cited by examiner

*Primary Examiner*—Michael Lebentritt
*Assistant Examiner*—Stanetta Isaac
(74) *Attorney, Agent, or Firm*—Stallman & Pollock LLP

(57) ABSTRACT

A method is provided for forming a graded junction in a semiconductor material having a first conductivity type. Dopant having a second conductivity type opposite the first conductivity type is introduced into a selected region of the semiconductor material to define a primary dopant region therein. The perimeter of the primary dopant region defines a primary pn junction. While introducing dopant into the selected region of the semiconductor material, dopant is simultaneously introduced into the semiconductor material around the perimeter of the primary dopant region and spaced-apart from the primary pn junction. The dopant in the both the primary dopant region and in the dopant around the perimeter of the primary dopant region is then diffused to provide a graded dopant region. The graded dopant region thus include an interior portion that has a first dopant gradient with a first maximum dopant concentration and a perimeter portion that is contiguous with the interior portion and has a second dopant gradient with a second maximum dopant concentration that is less than the first maximum dopant concentration.

3 Claims, 3 Drawing Sheets

METHOD OF IMPROVING THE BREAKDOWN VOLTAGE OF A DIFFUSED SEMICONDUCTOR JUNCTION

TECHNICAL FIELD

The present invention utilizes the small volume implant effect to grade the doping profile and improve breakdown voltage of junctions formed in semiconductor integrated circuit structures.

BACKGROUND OF THE INVENTION

Increasing the breakdown voltage of semiconductor junctions without reducing the doping levels is a common problem for new integrated circuit development.

Semiconductor junction breakdown is caused by the high electric field located at the junction. Various methods have been proposed to improve the breakdown for a given set of doping levels. These include grading the junction using multiple masks and/or multiple implants and using floating guard rings.

On heavily diffused junctions, multiple implants can cause problems due to unwanted vertical diffusion. To function properly, floating guard rings must be electrically isolated from the main junction; this is not possible with certain types of implants, such as n+ buried layers with overlying n-type epitaxial layer.

DESCRIPTION OF THE INVENTION

The present invention uses a single mask and a single implant to improve the breakdown voltage of a semiconductor junction over a conventional structure. The technique utilizes the "volume effect" of small implant windows to grade the doping of a single implant. The volume effect occurs when an implant is made through a small mask opening and the subsequent diffusion of the implant is large enough to drive dopant a distance greater than the size of the opening. Under these conditions, the doping at the center of the small mask opening will be lower than at the center of a larger mask opening. The technique works best with heavily diffused implants such as n+ buried layers.

Figure 1:
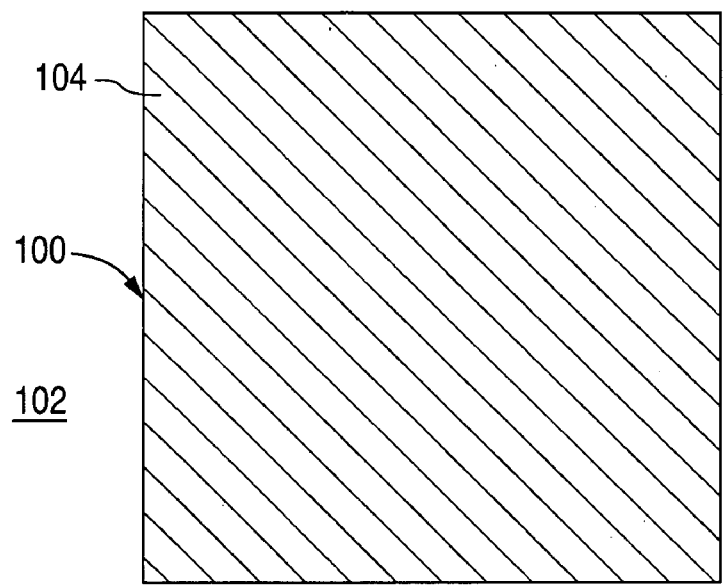
FIG. 1 illustrates a conventional layout of a simple junction.

FIG. 1 shows a conventional pn junction 100 formed at the interface between a semiconductor substrate 102 having a first conductivity type (e.g., P-type) and a dopant region 104 having a second conductivity type (e.g., N-type) opposite the first conductivity type formed in the semiconductor substrate 102. The shape of the region is unimportant, being illustrated as square in FIG. 1.

Figure 2:
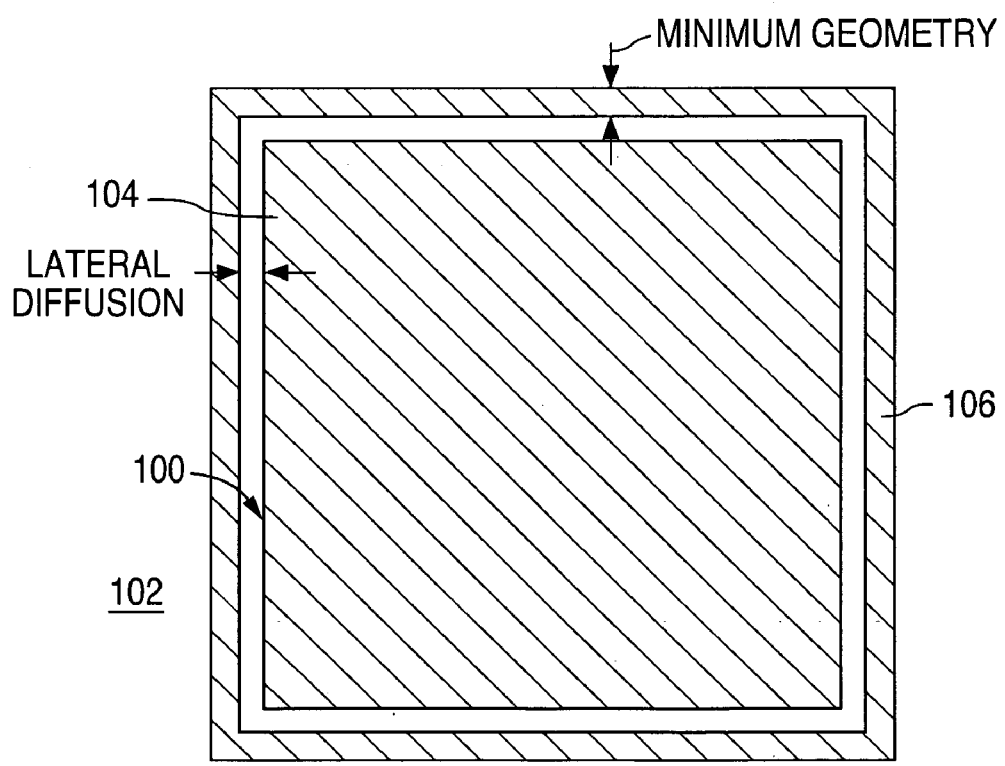
FIG. 2 illustrates a layout of a junction with a guard ring in accordance with the concepts of the present invention.

FIG. 2 shows a modified version of the FIG. 1 junction layout with a guard ring 106. The guard ring 106 is formed with the minimum possible masking dimension. That is, the mask opening utilized to introduce dopant atoms into the semiconductor substrate 102 to form the guard ring 106 is the minimum width that can be achieved with the particular integrated circuit fabrication process in use. The separation between the guard ring 106 and the primary junction 100 is selected to align with the lateral diffusion of the junction. This technique requires that the junction from the guard ring overlap (i.e. be contiguous with) the primary junction 100 after a subsequent thermal diffusion step. A conventional floating guard ring structure would require that the dopant ring to be placed further away so as to isolate the ring junction from the main junction after the diffusion step. This explains why the technique of the present invention can be used for n+ buried layer implants into a p-type substrate, which is then capped with n-type epitaxy. In this structure, no floating n-type layers are possible.

Figure 3:
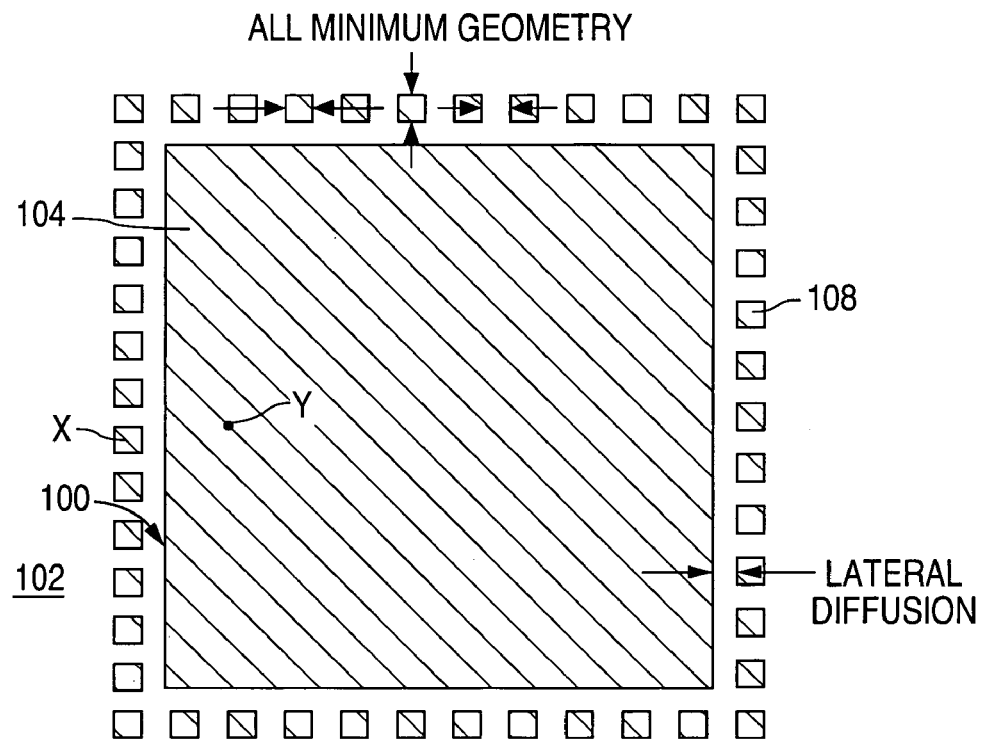
FIG. 3 illustrates a layout of a junction with grading islands in accordance with the concepts of the present invention.

FIG. 3 shows an alternate embodiment of the present invention. In the FIG. 3 junction structure, minimum geometry dopant islands 108 are formed around the primary junction 100. Again, the distance from the dopant islands 108 to the primary junction 100 is chosen to align with the lateral diffusion of the junction.

Figure 4:
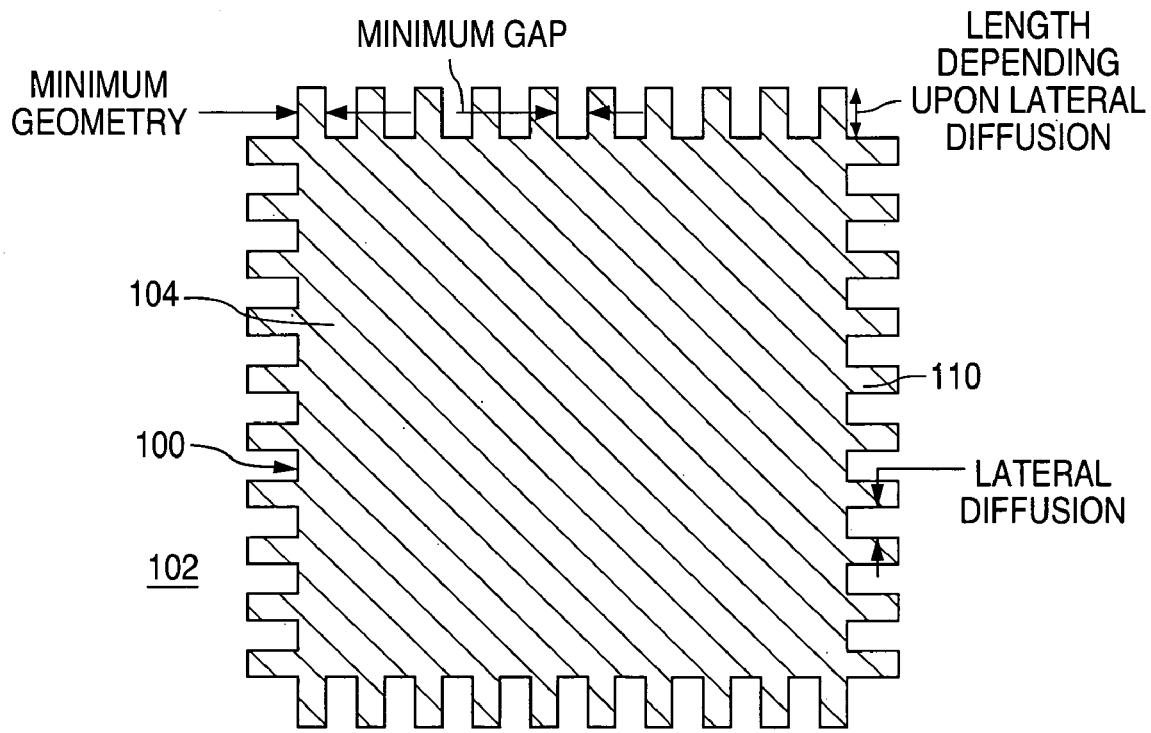
FIG. 4 illustrates a layout of a junction with grading fingers in accordance with the concepts of the present invention.

FIG. 4 shows another alternate implementation of the invention using dopant fringes 110. In this case, dopant fringes 110 are formed along the edge of the primary junction 100 on all four sides of the dopant region 104. Again, the size and pitch of the fringes 110 are the minimum possible masking dimension. The length of the fringes 110 must be greater than the diffusion of the implant. The fringe length in the FIG. 4 embodiment roughly corresponds to the extent of the islands 108 in the FIG. 3 embodiment.

The junction structures resulting from the FIGS. 2, 3 and 4 embodiments of the invention increase breakdown voltage by grading the doping profile of the junction even though only a single implant is used. To work, the minimum geometry of the ring 106 in the FIG. 2 embodiment, or the islands 108 in the FIG. 3, or the fringes in the FIG. 4 embodiment must be less than two times (2×) the lateral diffusion length of the junction during the thermal diffusion step. As is well known, the minimum geometry mask openings will restrict the amount of dopant that can be placed in the ring 106, the islands 108, or the fringes 110, relative to the amount of dopant that is placed in the primary dopant region 104. If the above restriction on minimum opening versus diffusion length is met, then the doping under the center of the mask opening will be reduced with respect to the doping under the center of the primary junction. That is, for example, the doping at location X in the FIG. 3 embodiment is less than doping at location Y. This grading of the junction improves the breakdown voltage of the junction.

Figure 5:
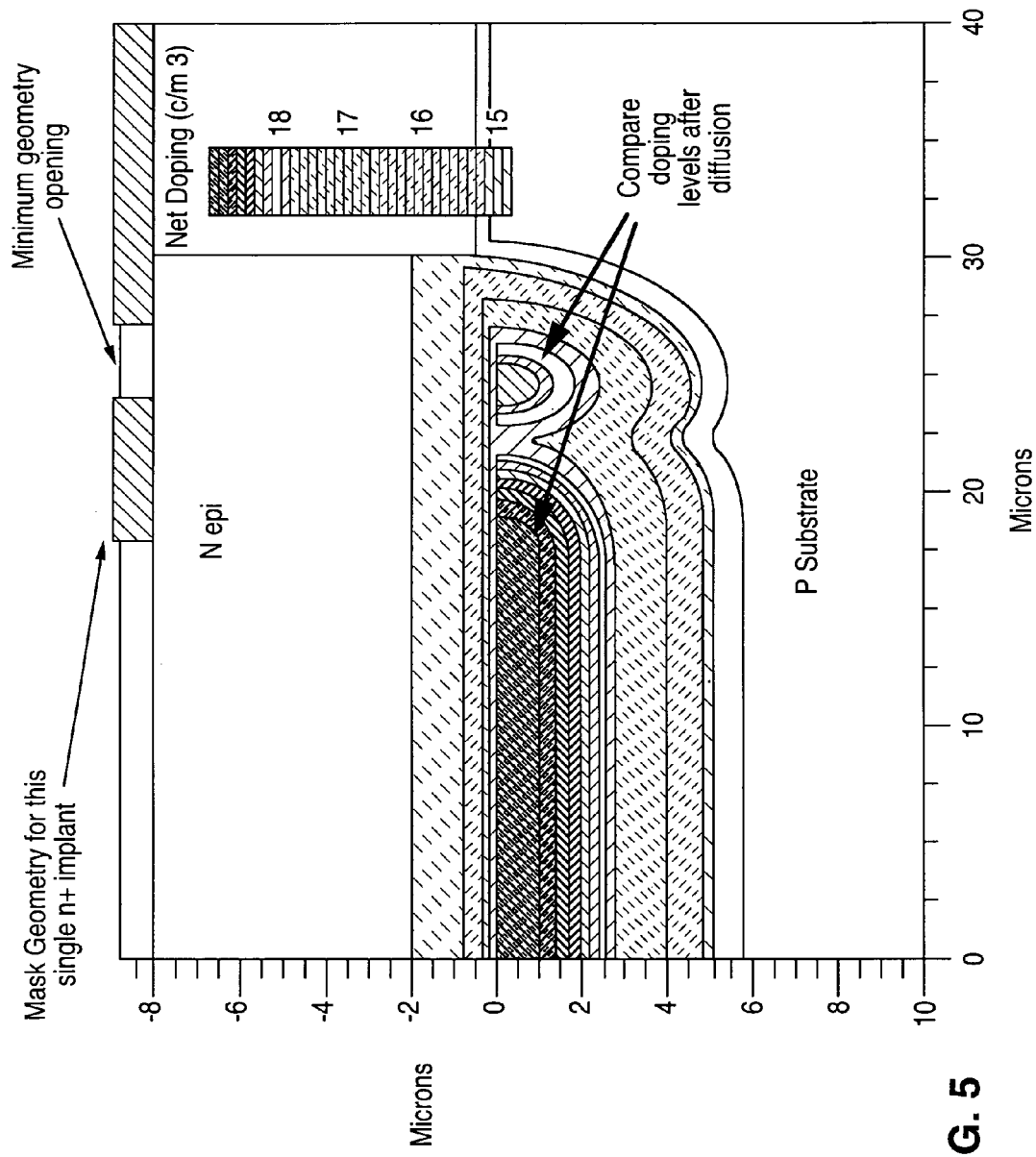
FIG. 5 illustrates a doping profile of a semiconductor junction formed in accordance with the concepts of the present invention.

FIG. 5 shows the representation of a doping profile of a semiconductor junction formed in accordance with the FIG. 2, 3 or 4 embodiments of the invention. This cross section corresponds to a section from point Y through point X in FIG. 3. A single n+ implant is made through the mask as drawn and there is a subsequent diffusion. The resulting doping profile shows a primary doping profile from the large mask opening to the left. The small mask opening generates a lower peak doping level that is diffused to join the primary doping profile. The lower doped region acts as an extension to the primary junction and grades the doping of the n+ implant. The particular structure shown in the FIG. 5 representation is an n+ buried layer on a p-substrate with an overlying n-type epitaxial layer, which is a typical application for the present invention.

Although only specific embodiments of the present invention are shown and described herein, the invention is not to be limited by these embodiments. Rather, the scope of the invention is to be defined by these descriptions taken together with the attached claims and their equivalents.

What is claimed is:

1. A method of forming a graded junction in a semiconductor substrate utilizing an integrated circuit fabrication technique that is characterized by a minimum geometry feature size, the semiconductor substrate having a first conductivity type, the method comprising:

forming a patterned mask on the upper surface of the semiconductor substrate, the patterned mask having a first mask opening formed therein that exposes a first surface region of the semiconductor substrate such that, when a dopant is introduced into the first substrate surface region through the first mask opening, a primary dopant junction is formed between a resulting first dopant region and the semiconductor substrate, the first surface region having dimensions that are greater than the minimum geometry feature size, the patterned mask further having a second mask opening formed therein that exposes a perimeter surface region of the semiconductor substrate, the perimeter surface region being defined around the perimeter of the first surface region and space-apart from the first surface region by a distance that is less than two times (2×) the lateral diffusion length of the dopant from the primary dopant junction during a thermal diffusion step applied to the semiconductor substrate;

introducing the dopant through the first mask opening into the first surface region of the semiconductor substrate to form a primary dopant region, the primary dopant region having a second conductivity type that is opposite the first conductivity type, the primary dopant region having a first dopant concentration, the perimeter of the primary dopant region defining the primary dopant junction between the primary dopant region and the semiconductor substrate;

simultaneously with forming the primary dopant region, introducing the dopant through the second mask opening into the perimeter surface region of the semiconductor substrate to form a perimeter dopant region having the second conductivity type in the semiconductor substrate around the perimeter of the primary dopant region such that the perimeter dopant region is spaced-apart from the primary dopant junction by a distance that is less than two times (2×) the lateral diffusion length of the primary junction during the thermal diffusion step, the perimeter dopant region having a second dopant concentration that is less than the first dopant concentration; and performing the thermal diffusion step such that the dopant in the primary dopant region and the dopant in the perimeter dopant region diffuse to merge to provide a single graded dopant region that includes an interior portion that has a first dopant gradient with a first maximum dopant concentration and a perimeter portion that is contiguous with the interior portion and has a second dopant gradient with a second maximum dopant concentration that is less than the first maximum dopant concentration.

2. A method of forming a graded junction in a semiconductor substrate utilizing an integrated circuit fabrication technique that is characterized by a minimum geometry feature size, the semiconductor substrate having a first conductivity type, the method comprising:

forming a patterned mask on an upper surface of the semiconductor substrate, the patterned mask including a first mask opening that exposes a first upper surface area of the semiconductor substrate, the first mask opening having a feature size that is greater than the minimum geometry feature size, and a second mask opening that defines a perimeter upper surface area of the semiconductor substrate that surrounds and is spaced-apart from the first upper surface area by a distance that is less than two times (2×) the lateral diffusion length of a dopant having a second conductivity type that is opposite the first conductivity type in the semiconductor substrate during a thermal diffusion step applied to the semiconductor substrate, the second opening having the minimum geometry feature size;

in a single ion implant step, utilizing the patterned mask to implant the dopant through the first mask opening into the first upper surface area of the semiconductor material to define a primary dopant region therein such that the primary dopant region defines a primary dopant junction between the primary dopant region and the semiconductor substrate, and through the second mask opening into the perimeter upper surface area of the semiconductor material to define a perimeter dopant ring therein that is spaced-apart from the primary dopant junction; and performing the thermal diffusion step such that the dopant in the primary dopant region and in the perimeter dopant ring diffuses to merge to provide a single graded dopant region that includes an interior portion that has a first dopant gradient with a first maximum dopant concentration and a perimeter portion that is contiguous with the interior portion and has a second dopant gradient with a second maximum dopant concentration that is less than the first maximum dopant concentration.

3. A method of forming a graded junction in a semiconductor substrate utilizing an integrated circuit fabrication technique that is characterized by a minimum geometry eture, the semiconductor substrate having a first conductivity type, the method comprising:

forming a patterned mask on an upper surface of the semiconductor substrate, the patterned mask including a first mask opening that exposes a first upper surface area of the semiconductor substrate that has feature size greater than the minimum feature size and a second set of mask openings that define a plurality of quadrilateral island areas on the upper surface of the semiconductor substrate, the island areas being disposed around and spaced-apart from the perimeter of the first upper surface area by a distance that is less than two times (2×) the lateral diffusion length of a dopant in the semiconductor substrate during a thermal diffusion step that is part of the integrated circuit fabrication technique, each of the plurality of island areas having the minimum geometry feature;

in a single ion implant step, utilizing the patterned mask to implant the dopant through the first mask opening into the first upper surface area of the semiconductor substrate to define a primary dopant region therein, the primary dopant region defining a primary dopant junction between the primary dopant region and the semiconductor substrate, and through the second set of mask openings into the upper surface island areas of the semiconductor substrate to define a plurality of quadrilateral perimeter dopant islands therein that are spaced-apart from the primary dopant region; and performing the thermal diffusion step such that dopant in the primary dopant region and dopant in the perimeter dopant islands diffuses to merge to provide a single graded dopant region that includes an interior portion that has a first dopant gradient with a first maximum dopant concentration and a perimeter portion that is contiguous with the interior portion and has a second dopant gradient with a second maximum dopant concentration that is less than the first maximum dopant concentration.

* * * * *